(12) United States Patent
Oh et al.

(10) Patent No.: US 7,859,106 B2
(45) Date of Patent: Dec. 28, 2010

(54) MULTILAYER PRINTED CIRCUIT BOARD USING PASTE BUMPS

(75) Inventors: Yoong Oh, Suwon-si (KR); Chang-Sup Ryu, Yongin-si (KR); Dong-Jin Park, Suwon-si (KR); Jee-Soo Mok, Yongin-si (KR); Byung-Bae Seo, Chungcheongbuk-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/588,165

(22) Filed: Oct. 6, 2009

(65) Prior Publication Data

US 2010/0025092 A1    Feb. 4, 2010

Related U.S. Application Data

(62) Division of application No. 11/602,332, filed on Nov. 21, 2006, now Pat. No. 7,622,329.

(30) Foreign Application Priority Data

Nov. 29, 2005    (KR) .................. 10-2005-0114696

(51) Int. Cl.
*H01L 23/48* (2006.01)
*H01L 21/00* (2006.01)

(52) U.S. Cl. ............... 257/737; 257/773; 257/E33.021; 438/107

(58) Field of Classification Search .............. None
See application file for complete search history.

(56) References Cited

U.S. PATENT DOCUMENTS

| | | | |
|---|---|---|---|
| 5,736,681 A * | 4/1998 | Yamamoto et al. | 174/265 |
| 5,865,934 A * | 2/1999 | Yamamoto et al. | 156/295 |
| 6,353,189 B1 * | 3/2002 | Shimada et al. | 174/255 |
| 6,872,893 B2 * | 3/2005 | Fukuoka et al. | 174/255 |
| 7,100,276 B2 * | 9/2006 | Fukuoka et al. | 29/830 |
| 7,238,603 B2 * | 7/2007 | Iijima et al. | 438/613 |
| 7,622,329 B2 * | 11/2009 | Oh et al. | 438/107 |
| 7,679,925 B2 * | 3/2010 | Fukuoka et al. | 361/761 |
| 2007/0235220 A1 | 10/2007 | Shin et al. | |

FOREIGN PATENT DOCUMENTS

| CN | 1347276 A | 5/2002 |
|---|---|---|
| JP | 7-74466 | 3/1995 |
| JP | 8-204334 | 8/1996 |

(Continued)

OTHER PUBLICATIONS

U.S. Appl. No. 11/602,332, filed Nov. 21, 2006, Yoong Oh, et al., Samsung Electro-Mechanics Co., Ltd.

(Continued)

*Primary Examiner*—Alonzo Chambliss

(57) ABSTRACT

A core substrate using paste bumps, the core substrate including a first paste bump board having a plurality of first paste bumps joined to a surface thereof; a second paste bump board having a plurality of second paste bumps facing the first paste bumps joined thereto; and an insulation element placed between the first paste bump board and the second paste bump board. In the core substrate, the first paste bumps and the second paste bumps are electrically interconnected.

8 Claims, 7 Drawing Sheets

FOREIGN PATENT DOCUMENTS

| | | |
|---|---|---|
| JP | 11-87912 | 3/1999 |
| JP | 11-087932 | 3/1999 |
| JP | 2003-309368 | 10/2003 |
| JP | 2004-281668 | 10/2004 |
| JP | 2005-520333 | 7/2005 |

OTHER PUBLICATIONS

U.S. Appl. No. 11/727,838, filed Mar. 28, 2007, Hee-Bum Shin, et al., Samsung Electro-Mechanics Co., Ltd.

Korean Office Action mailed on Nov. 17, 2006 in corresponding Korean patent application No. 10-2005-0114696.

Office Action issued in parent U.S. Appl. No. 11/602,332, dated May 16, 2008.

Office Action issued in parent U.S. Appl. No. 11/602,332, dated Aug. 6, 2008.

Office Action mailed on Aug. 26, 2008 and issued in corresponding Japanese Patent Application No. 2006-316471.

Japanese Office Action issued on Nov. 28, 2008 in corresponding Japanese Patent Application No. 2006-316471.

Office Action issued in parent U.S. Appl. No. 11/602,332, mailed Mar. 12, 2009.

Notice of Allowance and Fee issued in parent U.S. Appl. No. 11/602,332, mailed Jul. 27, 2009.

* cited by examiner

-PRIOR ART-

MULTILAYER PRINTED CIRCUIT BOARD USING PASTE BUMPS

CROSS-REFERENCE TO RELATED APPLICATIONS

This application is a divisional and claims priority to U.S. application Ser. No. 11/602,332, filed Nov. 21, 2006, which in turn claims the benefit of Korean Patent Application No. 2005-0114696 filed with the Korean Intellectual Property Office on Nov. 29, 2005, the disclosures of which are incorporated herein by reference in its entirety.

BACKGROUND

1. Field

The present invention relates to a core substrate, more particularly to a core substrate and multilayer printed circuit board using paste bumps.

2. Description of the Related Art

The conventional multilayer printed circuit board is manufactured by forming inner layer circuits on the surfaces of a core substrate, such as a copper clad laminate (CCL), etc., through the application of an additive process or a subtractive process, etc., and by forming outer layer circuits through the stacking of insulation layers and metal layers in order, by the same method as for the inner layer circuits.

That is, the method of manufacturing a multilayer printed circuit board according to prior art includes first perforating IVH's in a core substrate (e.g. a CCL, etc.) by mechanical drilling, etc., forming plating layers (e.g. by PNL plating, etc.) on the surfaces of the core substrate and on the inner perimeters of the IVH's, filling the inside spaces of the IVH's and polishing the surfaces, and then forming inner layer circuits on the surfaces of the core substrate by applying a subtractive process, etc.

Next, an insulation element is stacked and metal layers are formed on the surface, or an insulation element is stacked that already has a metal layer on its surface, such as RCC (resin coated copper), etc., onto the surfaces of the core substrate, after which BVH's are processed by laser drilling, etc., for electrical interconnection between the metal layers and inner layer circuits, PTH's which penetrate the entire cross section of the printed circuit board are perforated by mechanical drilling, etc., and outer layer circuit layers are formed on the surfaces of the insulation element by the same method as for the inner layer circuits.

However, the conventional method requires a plating process, which is complicated, expensive, and time-consuming. In order to simplify the complicated process of prior art and to manufacture a multilayer printed circuit board quickly and inexpensively by a collective stacking procedure, the so-called "B2IT (buried bump interconnection technology)" has been commercialized, which allows a simple and convenient stacking process by printing paste on a copper foil 3 to form bumps 2' and stacking an insulation element 1 thereon to prefabricate a paste bump board 4, as illustrated in FIG. 1.

Prior art related to the paste bump board includes an invention which uses a paste bump board having bumps made of conductive paste formed on a copper foil to allow simple and easy interconnection between the terminals of high-density electronic components.

To thus manufacture a core substrate having copper foil layers on both surfaces using conventional paste bump boards, an insulation element is stacked onto a paste bump board so that the paste bumps penetrate the insulation element, and a copper foil is stacked thereon, so that the copper foil layers of both surfaces may be electrically interconnected by the paste bumps.

However, in this method of manufacturing a double-sided substrate, there is a limit on the allowable height of the substrate according to the diameter of the paste bumps, which consequently becomes a limit on the thickness of the insulation element interposed within the double-sided substrate. A few examples of the maximum thicknesses that allow penetration of the insulation element according to the diameters of the paste bumps are listed below in the following table.

| Diameter of Paste Bumps | Maximum Thickness of Insulation Element (in the case of PPG) |
|---|---|
| 150 μm | 60 μm or lower |
| 130 μm | 40 μm or lower |
| 80 μm | 30 μm or lower |

As seen in the examples of the preceding table, since the allowable height is limited by the diameter of the paste bumps, the paste bumps must be formed with a diameter greater than a certain value in order to manufacture a core substrate having a particular thickness. This causes difficulties in adjusting the thickness of the double-sided substrate and causes problems in forming high-density wiring patterns on the copper foil layers.

SUMMARY

The present invention aims to provide a core substrate and multilayer printed circuit board using paste bumps, which allow easier interlayer electrical interconnection between circuit patterns, provide improved stiffness, and allow easier forming of high-density wiring.

One aspect provides a method of manufacturing a core substrate using paste bumps including: (a) aligning a pair of paste bump boards, each of which has a plurality of paste bumps joined to its surface, such that the paste bumps face each other, and (b) pressing the pair of paste bump boards together, where an insulation element is placed between the pair of paste bump boards.

Through-holes may be formed in the insulation element in correspondence with the positions of the plurality of paste bumps. The through-holes may be formed by laser drilling or mechanical drilling. The paste bumps may include silver paste.

A paste bump board may be formed by a process including: (c) printing the paste bumps on a copper foil, and (d) setting the paste bumps. The process may further include stacking the insulation element on the copper foil such that the paste bumps penetrate the insulation element, after the operation (d) of setting the paste bumps. It may be preferable that the paste bumps have strength greater than that of the insulation element.

Another aspect provides a core substrate using paste bumps including: a first paste bump board having a plurality of first paste bumps joined to its surface, a second paste bump board having a plurality of second paste bumps that face the first paste bumps joined thereto, and an insulation element placed between the first paste bump board and the second paste bump board, where the first paste bumps and the second paste bumps are electrically interconnected.

Through-holes may be formed in the insulation element in correspondence with positions of the first paste bumps or the second paste bumps. It may be preferable that the through-holes be formed in shapes corresponding to the shapes of the first paste bumps or the second paste bumps so as to hold the first paste bumps or the second paste bumps.

The through-hole may have uniform cross-sectional area along the thickness direction of the insulation element. The through-hole may have decreasing cross-sectional area along a thickness direction of the insulation element. The paste bumps may include silver paste.

The paste bump board may be formed by printing the paste bumps on a copper foil, setting the paste bumps, and stacking the insulation element on the copper foil such that the paste bumps penetrate the insulation element. Preferably, the paste bumps may have a strength greater than that of the insulation element.

Yet another aspect provides a multilayer printed circuit board using paste bumps, including: a first copper foil, a plurality of first paste bumps joined to a surface of the first copper foil, a plurality of second paste bumps electrically interconnected with the first paste bumps, a second copper foil to which the plurality of second paste bumps are joined, an insulation element which is placed between the first copper foil and the second copper foil and which holds the first paste bumps and the second paste bumps, an inner layer circuit formed by removing at least a portion of the first copper foil or the second copper foil, an outer layer board stacked on the first copper foil or the second copper foil, and an outer layer circuit formed on a surface of the outer layer board.

Additional aspects and advantages of the present invention will be set forth in part in the description which follows, and in part will be apparent from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings in which.

DETAILED DESCRIPTION

Embodiments of the present invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
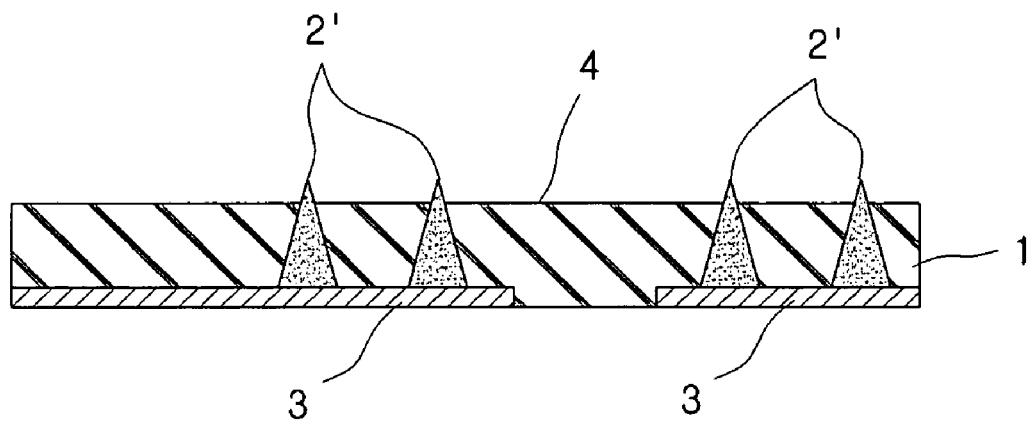
FIG. 1 is a cross-sectional view of a paste bump board according to prior art.
Figure 2:
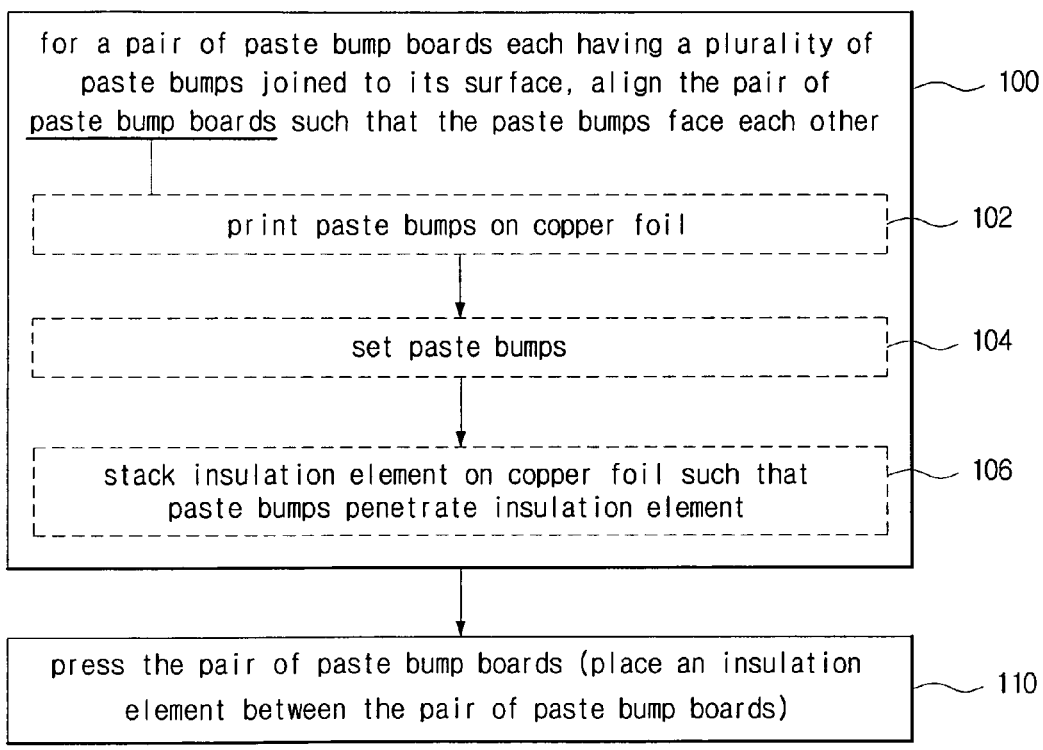
FIG. 2 is a flowchart illustrating a method of manufacturing a core substrate using paste bumps according to an embodiment.

FIG. 2 is a flowchart illustrating a method of manufacturing a core substrate using paste bumps according to an embodiment.

The embodiment is characterized by pressing a pair of paste bump boards together, to allow the forming of a core substrate having an interposed insulation element of a required thickness using paste bumps of much smaller diameters, to allow easy adjustment of the thickness of the core substrate, and to allow the forming of high-density wiring patterns.

To this end, a pair of paste bump boards, each having a plurality of paste bumps joined to its surface, are first aligned such that the paste bumps face each other (100). When the paste bump boards are pressed together, after aligning the respective paste bumps to face each other, the corresponding paste bumps are interconnected, to implement interlayer electrical interconnection between circuit patterns.

The paste bump board is a board having paste bumps printed beforehand on the surface of a copper foil, and to manufacture a paste bump board, paste bumps are printed on a copper foil (102), and the printed paste bumps are set (104).

By thus manufacturing the paste bump boards separately and stacking them collectively, the manufacturing time for the core substrate may be reduced. To make the collective stacking process more efficient, it may be desirable to stack the insulation element beforehand onto the copper foil on which paste bumps have been formed (106).

However, when forming the core substrate by placing an insulation element between a pair of paste bump boards and pressing, as in embodiments, it may also be preferable to place the insulation element during the process of pressing the paste bump boards, instead of stacking the insulation element for the core substrate beforehand.

It is advantageous that the paste bumps printed and set on the copper foil be greater in strength than the stacked insulation element. Thus, when the insulation element is stacked onto the copper foil, the paste bumps penetrate the insulation element, and can be exposed through the surface of the insulation, instead of being deformed.

However, the present invention is not necessarily limited to cases in which the strength of the paste bumps is greater than that of the insulation element, and as in an embodiment set forth below, there may be no problems in the interlayer electrical interconnection between circuit patterns even when the strength of the paste bumps are lower than that of the insulation element, if the paste bumps are pressed after forming through-holes in the insulation element beforehand.

While silver paste is typically used as the material for the paste bumps, other types of paste may obviously be used, within a scope apparent to those skilled in the art, in consideration of the strength, cost, and applicability, etc., of the paste.

Next, the pair of paste bump boards are pressed together to complete the core substrate (110). During the pressing process, the paste bumps are deformed in shape and are connected with each other. This forms interlayer electrical interconnection paths between circuit patterns, similar to via holes in a conventional printed circuit board.

As described above, when using the paste bump boards after stacking the insulation element, or when pressing the paste bump boards after placing the insulation element in-between, etc., the insulation element is positioned between the paste bump boards to form the core substrate.

When pressing the paste bump boards with the insulation element placed in-between, it may be advantageous to perforate through-holes in the insulation element beforehand. The through-holes are perforated in correspondence with the positions of the plurality of paste bumps joined to the paste bump boards. As such, the paste bump boards are stacked after perforating through-holes beforehand in the insulation element, and in the process of the paste bumps contacting each other and becoming deformed in shape, the through-holes formed in the insulation element act as guides of a sort, so that the electrical interconnection paths made by paste bumps may be implemented in a more stable manner.

In this case, as mentioned above, it is not necessary that the strength of the paste bumps be greater than the strength of the insulation element, and in some cases, the strength of the insulation element may be made greater than the strength of the paste bumps, so that the paste bumps may be deformed in shape to fill the through-holes. Here, the paste bumps filled in the through-holes act as interlayer electrical interconnection paths between circuit patterns.

The through-holes may be perforated by laser drilling or mechanical drilling. In the case of laser drilling, the cross sections of the through-holes decrease along the thickness direction of the insulation element, to form through-holes of a shape similar to an hourglass in the cross section of the insulation element, and in the case of mechanical drilling, the cross sections of the through-holes are formed uniformly along the thickness direction of the insulation element.

When the strength of the paste bumps is not greater than that of the insulation element, the shapes of the electrical interconnection paths are determined in accordance with the method of perforating the through-holes and the shapes of the through-holes.

Meanwhile, when pressing the pair of paste bump boards together after stacking the insulation element on the paste bump boards beforehand, or when the strength of the paste bumps is greater than that of the insulation element, the paste bump boards are pressed without separate through-holes formed in the interposed insulation element, such that the paste bumps penetrate the insulation element and contact each other to be deformed in shape and interconnected, whereby electrical interconnection paths are implemented.

Figure 3:
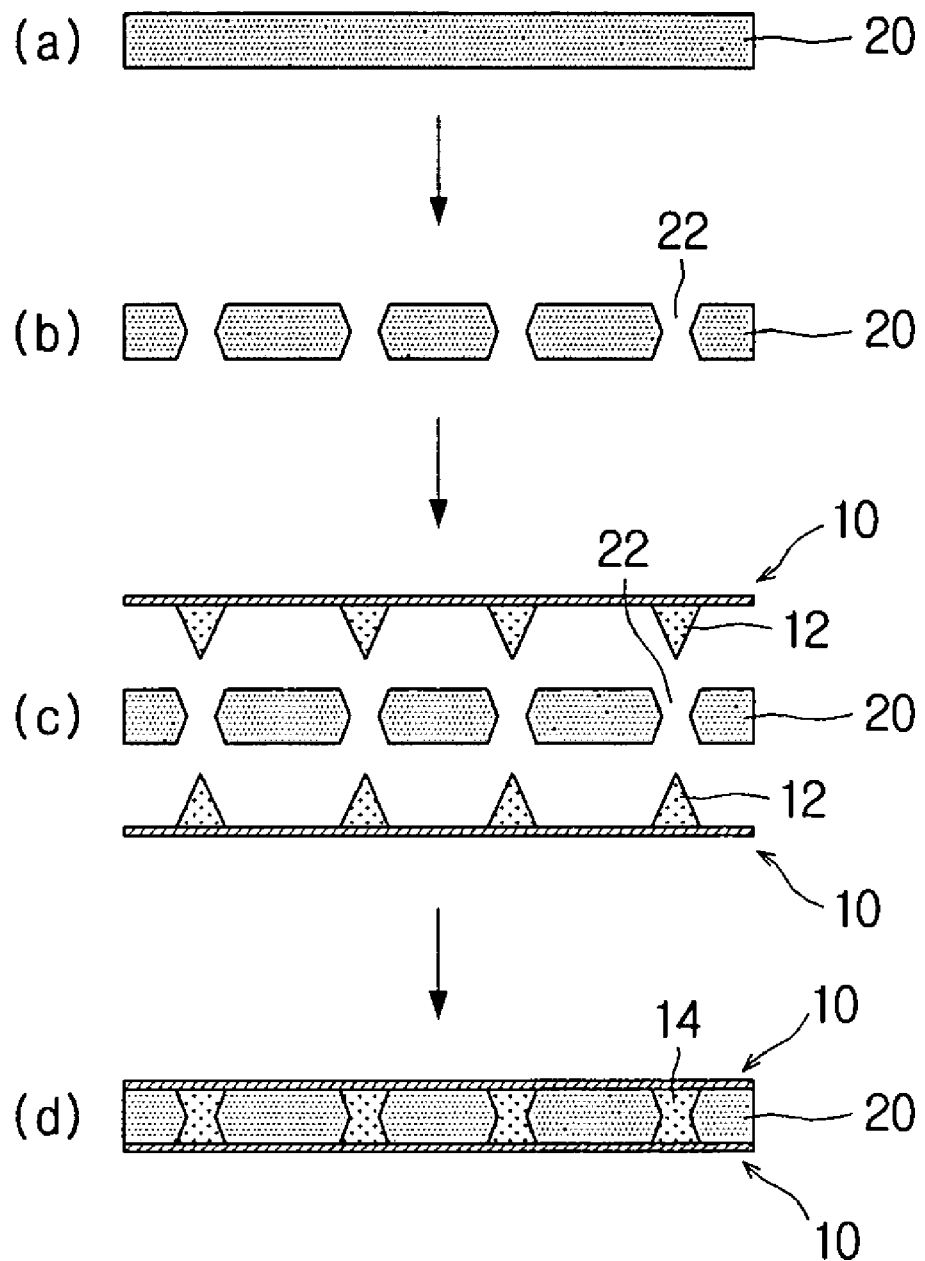
FIG. 3a is a cross-sectional view of an insulation element according to a first embodiment.
FIG. 3b is a cross-sectional view of an insulation element having through-holes according to a first embodiment.
FIG. 3c is a cross-sectional view of aligning a pair of paste bump boards according to a first embodiment.
FIG. 3d is a cross-sectional view of a pressing a pair of paste bump boards according to a first embodiment.

FIG. 3 is a flow diagram illustrating a process of manufacturing a core substrate using paste bumps according to a first disclosed embodiment of the present invention. In FIG. 3 are illustrated paste bump boards 10, paste bumps 12, electrical interconnection paths 14, an insulation element 20, and through-holes 22.

On an insulation element 20, such as that in (a) of FIG. 3, made of a material such as PPG, etc., through-holes 22 are perforated by laser drilling, as in (b) of FIG. 3. The through-holes 22 are formed in correspondence with the positions where the paste bumps 12 are connected, when the insulation element 20 is joined with the paste bump board 10.

As in (c) of FIG. 3, a pair of paste bump boards 10 are aligned from both sides of the interposed insulation element 20. Here, the paste bumps 12 are positioned to face each other, and the positions of the through-holes 22 perforated in the insulation element 20 are aligned with the positions of the paste bumps 12.

However, (a) through (c) of FIG. 3 do not represent a sequential order, and it is apparent that the case of preparing the paste bump boards 10 and the insulation element 20 regardless of the order illustrated in FIG. 3 and aligning the positions as in (c) of FIG. 3 is encompassed within the scope of the present invention.

After thus aligning the positions, the pair of paste bump boards 10 are pressed together as in (d) of FIG. 3, whereby the paste bumps 12 are filled in the through-holes 22 perforated in the insulation element 20 and interconnected with each other, to implement electrical interconnection paths 14.

Figure 4:
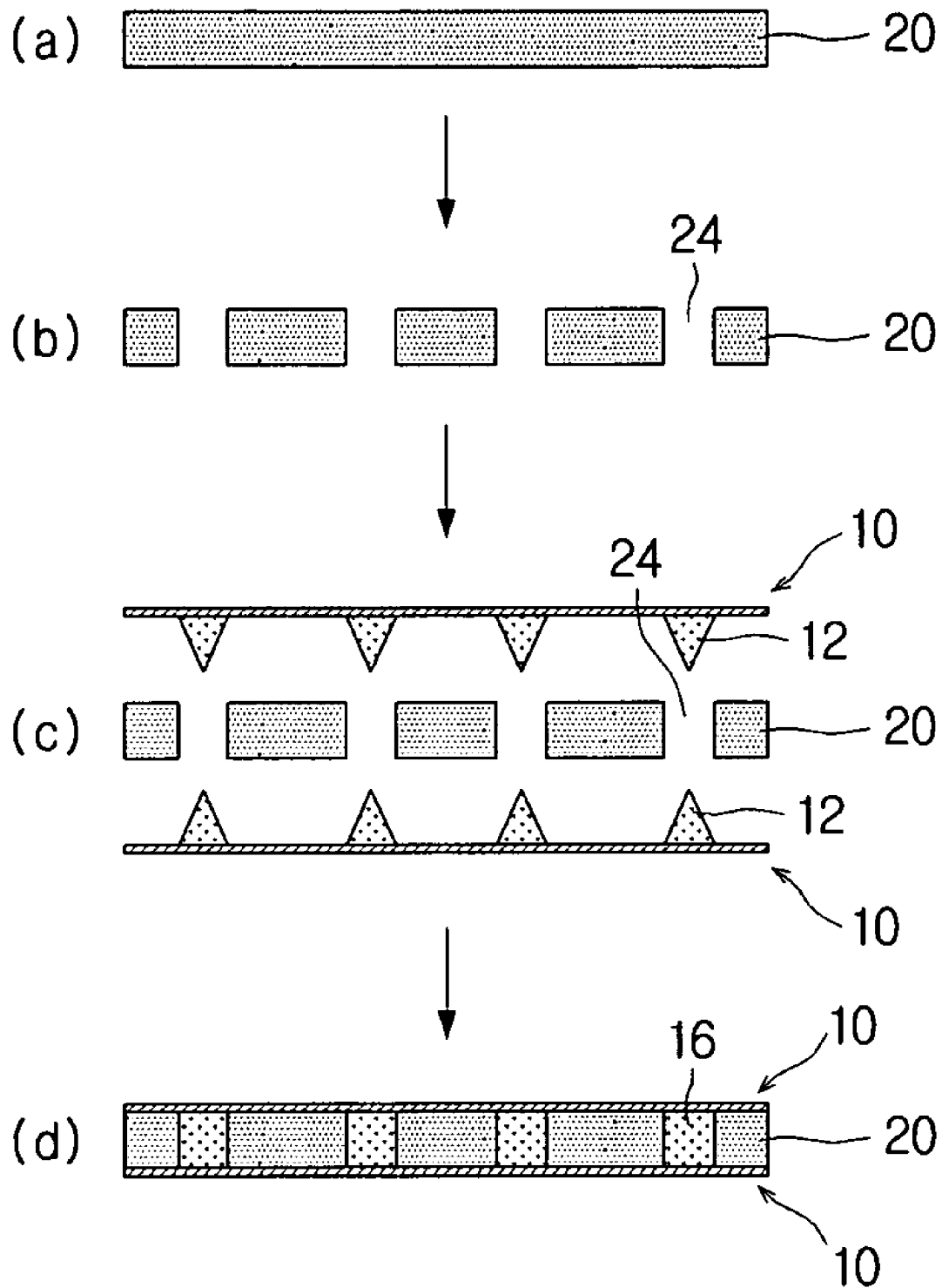
FIG. 4a is a cross-sectional view of an insulation element according to a second embodiment.
FIG. 4b is a cross-sectional view of an insulation element having through-holes according to a second embodiment.
FIG. 4c is a cross-sectional view of aligning a pair of paste bump boards according to a second embodiment.
FIG. 4d is a cross-sectional view of pressing a part of paste bump boards according to a second embodiment.

FIG. 4 is a flow diagram illustrating a process of manufacturing a core substrate using paste bumps according to a second disclosed embodiment of the present invention. In FIG. 4 are illustrated paste bump boards 10, paste bumps 12, electrical interconnection paths 16, an insulation element 20, and through-holes 24.

The second disclosed embodiment differs from the first disclosed embodiment in the method of perforating and form of the through-holes 24 in the insulation element 20.

That is, as in (b) of FIG. 4, the through-holes 24 are perforated in the insulation element 20 by mechanical drilling. Comparing to the laser drilling of the first disclosed embodiment, the perforating by mechanical drilling produces through-holes that have uniform cross sections in the direction of thickness of the insulation element 20.

As such, the method of perforating the through-holes 24 affects the shapes of the through-holes 24, which consequently determines the shapes of the paste bumps 12 filled in the through-holes 24, i.e. the shapes of the electrical interconnection paths 16.

As with the first disclosed embodiment, (a) through (c) of FIG. 4 do not represent a sequential order, and it is apparent that the case of preparing the paste bump boards 10 and the insulation element 20 regardless of the order illustrated in FIG. 4 and aligning the positions as in (c) of FIG. 4 is encompassed within the scope of the present invention.

Figure 5:
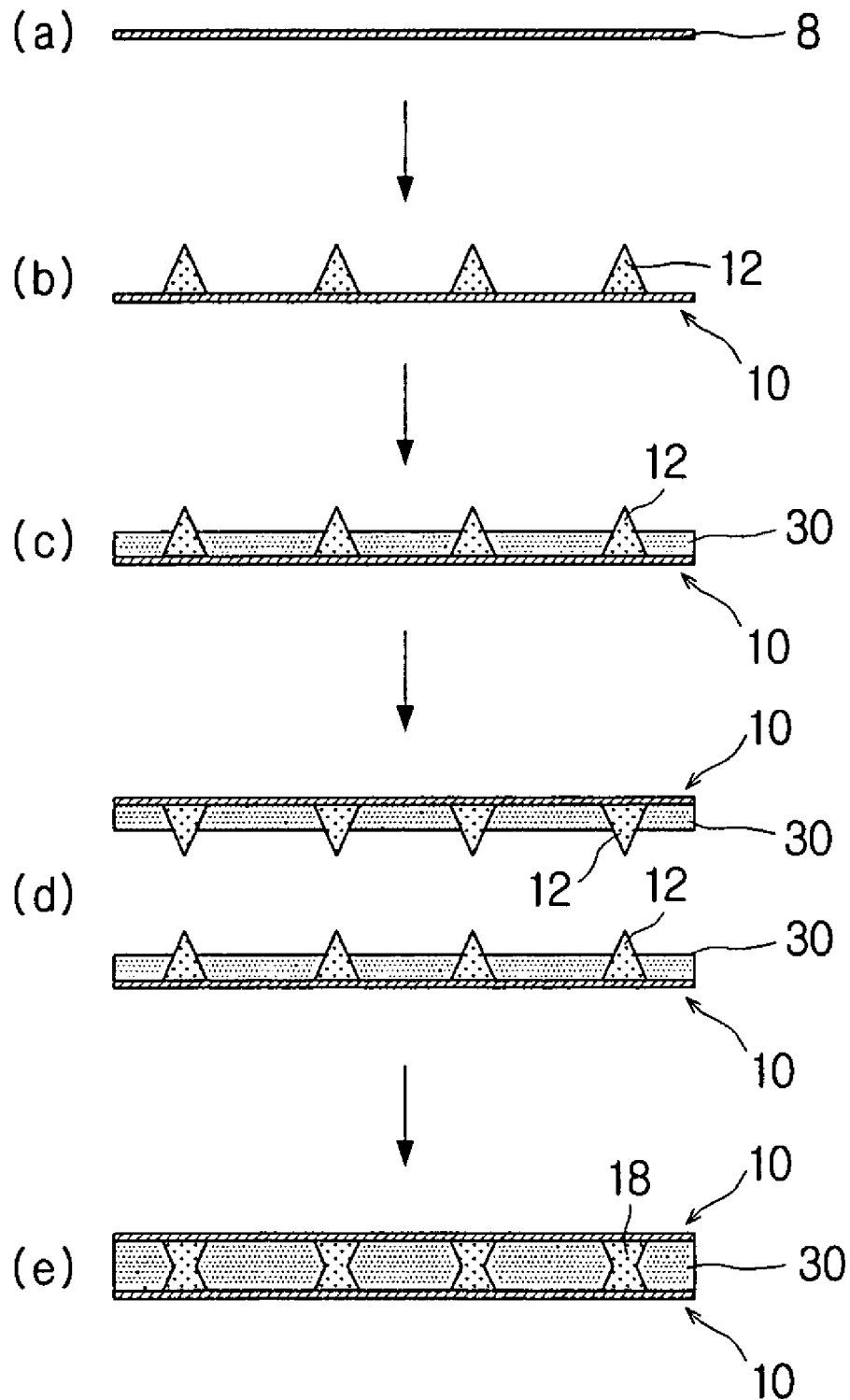
FIG. 5a is a cross-sectional view of a copper foil according to a third embodiment.
FIG. 5b is a cross-sectional view of printing a paste bumps on a copper foil according to a third embodiment.
FIG. 5c is a cross-sectional view of stacking an insulation element on a copper foil according to a third embodiment.
FIG. 5d is a cross-sectional view of aligning a pair of paste bump boards according to a third embodiment.
FIG. 5e is a cross-sectional view of pressing a pair of paste bump boards according to a third embodiment.

FIG. 5 is a flow diagram illustrating a process of manufacturing a core substrate using paste bumps according to a third disclosed embodiment of the present invention. In FIG. 5 are illustrated a copper foil 8, paste bump boards 10, paste bumps 12, electrical interconnection paths 18, and insulation elements 30.

The third disclosed embodiment differs from the first and second disclosed embodiments set forth above, in that the paste bump boards 10 are pressed after stacking the insulation elements 30 beforehand.

That is, onto a copper foil 8 such as that in (a) of FIG. 5, paste bumps 12 are printed and set to form a paste bump board 10, as in (b) of FIG. 5, after which the insulation element 30 is stacked on the copper foil 8 so that the paste bumps 12 penetrate the insulation element 30, as in (c) of FIG. 5. Here, as with the first and second disclosed embodiments set forth above, in order for the paste bumps 12 to penetrate the insulation element 30 simply by stacking the insulation element 30, without through-holes 24 formed beforehand in the insulation element 30, it is desirable that the strength of the paste bumps 12 be greater than that of the insulation element 30.

Next, as in (d) of FIG. 5, a pair of paste bump boards 10 each having an insulation element 30 stacked thereon are aligned in position such that the paste bumps 12 face each other, and are pressed together as in (e) of FIG. 5 to form a core substrate. As in the first and second disclosed embodiments, the paste bumps 12 facing each other are pressed into contact and their shapes are deformed, to become electrically interconnected.

Forming the core substrate by thus pressing a pair of paste bump boards 10 each having an insulation element 30 stacked beforehand, entails a simple process which does not require adjusting the thicknesses of the insulation elements 30 for contact between the paste bumps 12, and the process of aligning the positions of the through-holes with the positions of the paste bumps, which may be included in the first and second disclosed embodiments set forth above, is omitted, for a reduction in manufacture time.

Figure 6:
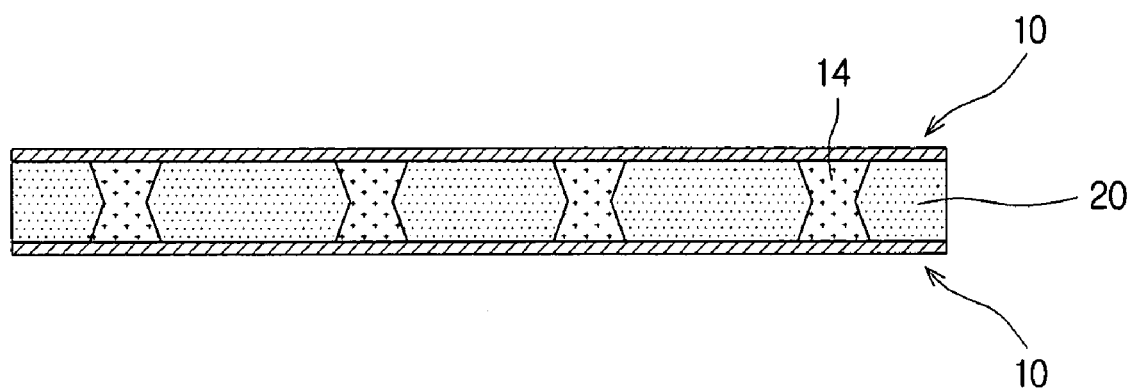
FIG. 6 is a cross-sectional view of a core substrate using paste bumps according to an embodiment.

FIG. 6 is a cross-sectional view of a core substrate using paste bumps according to an embodiment of the present invention. In FIG. 6 are illustrated a paste bump board 10, electrical interconnection paths 14, and an insulation element 20.

The core substrate, manufactured by a method of manufacturing a core substrate using paste bumps 12 according to an embodiment of the invention, is formed by placing an insulation element 20 between a pair of paste bump boards 10, each having a plurality of paste bumps 12 joined to its surface, and pressing together.

Here, the paste bumps 12 joined to each paste bump board 10 face each other, and the pressing causes them to be electrically interconnected, to implement interlayer electrical interconnection paths 14 between circuit patterns.

Through-holes may be formed beforehand in the insulation element 20 placed between the paste bump boards 10 in correspondence with the positions of the paste bumps 12. The through-holes act as guides of a sort, which assist the paste bumps 12 to be electrically interconnected as they are filled in, and thus they may advantageously be formed in shapes corresponding to the shapes of the paste bumps 12 so as to hold the paste bumps 12.

In this case, there are no problems in implementing the electrical connection paths 14 by pressing the paste bump boards 10, even if the strength of the insulation element 20 is greater than the strength of the paste bumps 12, and the shapes of the electrical interconnection paths 14 can be determined by modifying the shapes of the through-holes.

To maximize the efficiency of interlayer electrical interconnection, the through-holes may be given cross sections that are uniform in the thickness direction of the insulation element 20. This may be implemented by perforating the through-holes by mechanical drilling.

Meanwhile, to maximize the precision and the degree of filling of the through-holes, the through-holes may be given cross sections that decrease along the thickness direction from the surface of the insulation element 20. This may be implemented by perforating the through-holes by laser drilling.

However, the present invention is not necessarily limited to the above cases with regards the shapes of the through-holes, and through-holes having other shapes or formed by other perforating methods may obviously be included, within a scope apparent to those skilled in the art, in consideration of the manufacturing time, cost, and quality, etc.

As opposed to the case of forming through-holes beforehand in the insulation element 20 and pressing the paste bump boards 10, the strength of the paste bumps 12 is made greater than the strength of the insulation material 20, for the case of forming a core substrate by pressing paste bump boards 10 while an insulation element 20 not having through-holes perforated is positioned in-between, so that during the pressing process, the paste bumps 12 penetrate the insulation element 20 to be electrically interconnected with each other.

Figure 7:
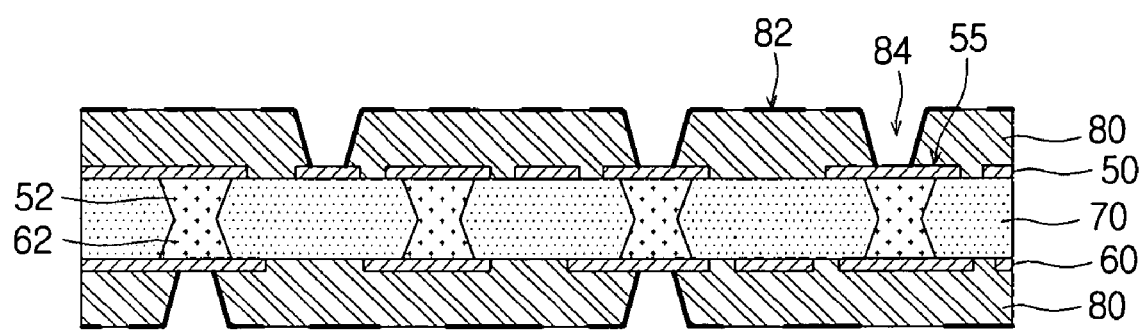
FIG. 7 is a cross-sectional view of a multilayer printed circuit board using paste bumps according to an embodiment.

FIG. 7 is a cross-sectional view of a multilayer printed circuit board using paste bumps according to an embodiment of the present invention. In FIG. 7 are illustrated a first copper foil 50, first paste bumps 52, inner layer circuits 55, a second copper foil 60, second paste bumps 62, an insulation element 70, outer layer boards 80, outer layer circuits 82, and via holes 84.

FIG. 7 shows a multilayer printed circuit board formed using a core substrate using paste bump boards according to an embodiment of the invention. In the multilayer printed circuit board according to the present embodiment, the core substrate is formed by pressing a pair of paste bump boards with an insulation element 70 positioned in-between, while inner layer circuits 55 are formed on the copper foils of the paste bump boards.

One or more outer layer boards 80 may further be stacked, as necessary, on the core substrate having the inner layer circuits 55, and an outer layer circuit 82 is formed on the surface of each outer layer board 80 to manufacture a multilayered printed circuit board. The interlayer electrical interconnection between inner layer circuits 55 and outer layer circuits 82, i.e. circuit patterns, is implemented by forming via holes 84, such as typical IVH's and BVH's, etc.

Circuit patterns such as the inner layer circuits 55 and outer layer circuits 82 may be formed by applying a typical additive process or subtractive process. As this is a matter known to those skilled in the art, detailed descriptions will not be provided.

Also, the multilayered printed circuit board may be manufactured using paste bump boards for the outer layer boards 80, whereby adjusting the positions of the paste bumps joined to the paste bump boards used as the outer layer boards 80, the interlayer electrical interconnection between circuit patterns may be implemented without forming separate via holes 84.

That is, the multilayer printed circuit board according to this embodiment has the basic composition of a first copper foil 50, a plurality of first paste bumps 52 joined to the surface of the first copper foil 50, a plurality of second paste bumps 62 electrically interconnected with the first paste bumps 52, and a second copper foil 60 to which the plurality of second paste bumps 62 are joined, which is formed by pressing a pair of paste bump boards.

An insulation element 70 for holding the paste bumps is placed between the pair of paste bump boards, i.e. between the first copper foil 50 and the second copper foil 60. As mentioned in the descriptions of the embodiments set forth above regarding the core substrate, there may be through-holes formed beforehand in the insulation element 70, or the insulation element 70 may be formed to hold the paste bumps without forming through-holes by making the paste bumps greater in strength than the insulation element 70.

The copper foils of the paste bump boards are exposed at the surfaces of the core substrate, formed by thus pressing a pair of paste bump boards. The core substrate according to embodiments of the invention has a composition similar to a copper clad laminate (CCL), in that there is a copper foil exposed at the surface, but there is a difference in that there are electrical interconnection paths inside formed by the paste bumps.

Circuit patterns corresponding to the inner layer circuits 55 may be formed on the surfaces of the core substrate, i.e. on the first copper foil 50 and second copper foil 60, by applying a typical subtractive process, etc. To manufacture a multilayer printed circuit board, outer layer boards 80 are applied on the surfaces of the core substrate, i.e. on the first copper foil 50 and second copper foil 60, with circuit patterns corresponding to the outer layer circuits 82 formed on the surfaces of the outer layer board 80.

The outer layer circuits 82 may be formed by applying a typical additive process or a subtractive process, etc., and as this is a matter known to those skilled in the art, detailed descriptions will not be provided.

While the interlayer electrical interconnection between circuit patterns is typically implemented by via holes 84 in a multilayer printed circuit board having inner layer circuits 55 and outer layer circuits 82, the interlayer electrical interconnection between circuit patterns may also be implemented, as described above, without the forming of separate via holes 84, by using paste bump boards for the outer layer boards 80.

According to the present invention comprised as above, it is easier to implement interlayer electrical interconnection between circuit patterns, the thickness of the core substrate can readily be adjusted by adjusting the thickness of the insulation layer, the stiffness is improved as a pair of paste bump boards are pressed from the top and bottom, and high-density wiring can be formed more easily as the paste bumps are connected in pairs so that the diameters of the paste bumps formed on the paste bump boards can be reduced.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A multilayer printed circuit board using paste bumps, the multilayer printed circuit board comprising:
   a first copper foil;
   a plurality of first paste bumps joined to a surface of the first copper foil;
   a plurality of second paste bumps electrically interconnected with the first paste bumps;
   a second copper foil having the plurality of second paste bumps joined thereto;
   an insulation element placed between the first copper foil and the second copper foil and holding the first paste bumps and the second paste bumps;
   an inner layer circuit formed by removing at least a portion of the first copper foil or the second copper foil;
   an outer layer board stacked on the first copper foil or the second copper foil; and
   an outer layer circuit formed on a surface of the outer layer board.

2. The multilayer printed circuit board of claim 1, wherein through-holes are formed in the insulation element in correspondence with positions of the first paste bumps or the second paste bumps.

3. The multilayer printed circuit board of claim 2, wherein the through-holes are formed in shapes corresponding to shapes of the first paste bumps or the second paste bumps so as to hold the first paste bumps or the second paste bumps.

4. The multilayer printed circuit board of claim 3, wherein at least one of the through-holes has uniform cross-sectional area along a thickness direction of the insulation element.

5. The multilayer printed circuit board of claim 3, wherein at least one of the through-holes has decreasing cross-sectional area along a thickness direction of the insulation element.

6. The multilayer printed circuit board of claim 1, wherein the paste bumps include silver paste.

7. The multilayer printed circuit board of claim 1, wherein the paste bump board is formed by printing the paste bumps on a copper foil, setting the paste bumps, and stacking the insulation element on the copper foil such that the paste bumps penetrate the insulation element.

8. The multilayer printed circuit board of claim 7, wherein the paste bumps have a strength greater than that of the insulation element.

* * * * *